United States Patent
Sun et al.

(10) Patent No.: US 7,855,399 B2
(45) Date of Patent: Dec. 21, 2010

(54) PROTECTION DEVICE OF PROGRAMMABLE SEMICONDUCTOR SURGE SUPPRESSOR HAVING DEEP-WELL STRUCTURE

(75) Inventors: Walance Sun, Suzhou (CN); Ken Ou, Suzhou (CN); Shouming Zhang, Beijing (CN); Man Ng, Hongkong (CN)

(73) Assignee: Semitel Electronics Co., Ltd., Suzhou (CN)

( * ) Notice: Subject to any disclaimer, the term of this patent is extended or adjusted under 35 U.S.C. 154(b) by 0 days.

(21) Appl. No.: 12/585,820

(22) Filed: Sep. 25, 2009

(65) Prior Publication Data

US 2010/0181597 A1 Jul. 22, 2010

(30) Foreign Application Priority Data

Aug. 26, 2009 (CN) .................... 2009 1 0034849

(51) Int. Cl.
*H01L 29/73* (2006.01)
(52) U.S. Cl. ................ 257/173; 257/E29.211
(58) Field of Classification Search ............... 257/173, 257/335, 355, 360–365, E29.211
See application file for complete search history.

(56) References Cited

U.S. PATENT DOCUMENTS

| | | | |
|---|---|---|---|
| 6,870,202 B2* | 3/2005 | Oka | 257/173 |
| 7,019,338 B1* | 3/2006 | Ballon | 257/173 |
| 7,081,654 B2* | 7/2006 | Husher | 257/355 |
| 7,205,611 B2* | 4/2007 | Honjoh et al. | 257/355 |
| 7,579,632 B2* | 8/2009 | Salih et al. | 257/173 |
| 2009/0079001 A1* | 3/2009 | Salih et al. | 257/355 |
| 2010/0103570 A1* | 4/2010 | Song et al. | 361/56 |
| 2010/0155775 A1* | 6/2010 | Gauthier et al. | 257/173 |
| 2010/0171149 A1* | 7/2010 | Denison et al. | 257/173 |

* cited by examiner

*Primary Examiner*—Nathan W Ha
(74) *Attorney, Agent, or Firm*—Oliff & Berridge, PLC

(57) ABSTRACT

A protection device of programmable semiconductor surge suppressor having deep-well structure is provided comprising one, two or four protection units, each of which is composed of a PN-junction diode, a PNPN-type thyristor and a NPN-type triode connected with each other. It is characterized in that in the diode area on the frontal side of the N-type semiconductor base is formed a PN junction with impurity concentration changed gradiently from top to bottom according to the order of P+, P, N and N+; and a group of deep-wells with P-type impurities are positioned at the interface of the PN junction, making the PN junction form a concave-convex type interface. The present invention can be used in the program-controlled switchboard to protect the Subscriber Line Interface Circuit (SLIC) board. The above improvement can further improve the anti-lightning and anti-surge performance and the energy discharge capability of the whole device. The device of the present invention can reach a level of 3000~3500 V according to the anti-lightning performance test.

5 Claims, 5 Drawing Sheets

C-C

PROTECTION DEVICE OF PROGRAMMABLE SEMICONDUCTOR SURGE SUPPRESSOR HAVING DEEP-WELL STRUCTURE

FIELD OF THE INVENTION

The present invention relates to a protection device of transient voltage suppressor, particularly to a protection device of programmable semiconductor surge suppressor used for protecting a Subscriber Line Interface Circuit (SLIC) board on a program-controlled switchboard in a telephone network.

BACKGROUND OF THE INVENTION

With development of the telephone communication network, it has always been an important problem drawing attention of those skilled in the art how to effectively prevent surge overvoltage caused by lightning strike, AC power supply fluctuation or electromagnetic induction from destroying the communication equipment. After all the Euramerican countries issued an communication equipment anti-lightning and anti-surge standard of their own, our country also issued in 1998 the Communication Business Standard YD/T9931998 of the People's Republic of China—Technical Requirement and Experimental Method of Telecommunications Terminal Equipment against Lightning Strike. Within as short as several tens of years, the anti-surge protection device successively took the forms of a gas discharge tube, a TVS diode, a semiconductor solid discharge tube and a programmable protection device of transient voltage suppressor.

Fang ZHANG and Qiuping S U published a paper entitled "a protect device of programmable semiconductor surge suppressor" in Modern Electronic Technique 9 (200), 2005. This paper introduced circuit structure (as shown in FIG. 1) and operating principle of a fourth-generation programmable anti-surge protection device P61089, and analyzed mechanism of the device protecting the Subscriber Line Interface Circuit (SLIC) board on the program-controlled switchboard. The research showed that P61089 is a two-way bi-directional semiconductor anti-surge protection device, also based on the PNPN structure and principle, whose performance is also greatly improved better than the semiconductor anti-surge protection devices of the prior three generations; and meanwhile the device is further provided with a forward protection diode for clamping a forward surge and a gate-controlled triode for triggering, which thus allows hardware programming on the protective voltage (the programming range is −10~−75 V to earth). P61089 is currently used in almost all of the program-controlled switchboards for protecting the SLIC board. However, lightning strike and surge still do damage to the telephone communication equipment, which puts forward higher requirements on anti-lightning performance of the semiconductor anti-surge protection device. The current programmable anti-surge protection device P61089 can only reach around 2000 V according to an anti-lightning performance test. Therefore, it is the problem the present invention studies how to improve the anti-lightning and anti-surge performance and the energy discharge capability of the current protection device of programmable semiconductor surge suppressor.

CONTENTS OF THE INVENTION

The present invention provides a protection device of programmable semiconductor surge suppressor having deep-well structure. It is aimed to improve the anti-lightning and anti-surge performance and the energy discharge capability of the current protection device of programmable semiconductor surge suppressor through improving the structure design, so as to overcome the shortcomings of the prior technics in this aspect.

In order to realize the above-mentioned purpose, the present invention adopts the following technical solution: A programmable semiconductor anti-surge protection device having deep-well structure is provided, comprising one, two or four protection units, each of the protection units being composed of a PN junction diode, a PNPN-type thyristor and a NPN-type triode; anode of the diode and cathode of the thyristor, connected with each other, act together as Port K of the protection unit; cathode of the diode, anode of the thyristor and collector of the triode, connected with each other, act together as Port A of the protection unit; and emitter of the triode and gate of the thyristor are connected with each other, base of the triode acting as Port G of the protection unit (this is from the aspect of the circuit connection).

The present invention is innovative in the following aspects:

Said protection device used an N-type semiconductor base as a substrate, viewed from the top, each of the protection units corresponds to a semiconductor active region which is composed of a diode area, a thyristor area and a triode area (this is from the aspect of semiconductor structure);

viewed from the cross section, in the diode area on the frontal side of the substrate are positioned sequentially from top to bottom a P-type heavy diffusion layer and a P diffusion layer, in the diode area on the reverse side of the substrate is positioned from bottom to top an N-type heavy implanted layer, between the P diffusion layer and the N-type heavy implanted layer of the diode area is an N-type light doped layer of the substrate itself, and thus in the diode area is formed a PN junction with impurity concentration changed gradiently from top to bottom according to the order of P+, P, N and N+; and a group of deep-wells are positioned at intervals at the interface between the P-type diffusion layer and the N-type light doped layer, each of the deep-wells being formed by means of boring a contact or trenching a trench downwards from the top of the N-type light doped layer before depositing P-type or P-type light impurity in the contact or trench, the top of the P-type doped or P-type light doped materials deposited in the contact or trench being connected with the bottom of the P-type diffusion layer, thus a concave-convex interface being formed in the PN junction.

The relevant content in the above-mentioned technical solution is explained as below:

1. Viewed from the cross section in the above-mentioned solution, in the thyristor area on the frontal side of the substrate are positioned sequentially from top to bottom an N-type heavy implanted layer and a P-type diffusion layer, in the thyristor area on the reverse side of the substrate is positioned from bottom to top a P-type heavy diffusion layer, between the P-type diffusion layer and the P-type heavy diffusion layer of the thyristor area is an N-type light doped layer of the substrate itself, and thus a PNPN-type thyristor is formed from bottom to top in the thyristor area. In the N-type heavy implanted layer of the thyristor area are positioned at intervals a group of short-circuit contacts, each of which is connected at the top with an upper metal layer positioned above the N-type heavy implanted layer, the P diffusion layer below the N-type heavy implanted layer extending upwards to the upper metal layer through the short-circuit contact.

2. Viewed from the cross section in the above-mentioned solution, in the triode area on the frontal side of the substrate are positioned sequentially from top to bottom a first N-type heavy implanted layer and a P-type diffusion layer, in the triode area on the reverse side of the substrate is positioned from bottom to top a second N-type heavy implanted layer, between the P-type diffusion layer and the second N-type heavy implanted layer of the triode area is the N-type light doped layer of the substrate itself, and thus an NPN-type triode is formed from top to bottom in the triode area. The P-type diffusion layer of the triode area is provided at the level outer peripheral portion with a P-type heavy diffusion ring, which is connected with the P-type diffusion layer of the triode area.

The principle and effect of the present invention is as below: As for a protection unit composed of a diode, a thyristor and a triode as shown in FIGS. 5~7, the diode discharges the surge energy when a forward surge appears, and the thyristor discharges the surge energy when a backward surge appears. Because the thyristor itself is better at discharging the surge energy while the diode poorer, so how to improve the discharge capability of the diode is the key for improving the anti-lightning and anti-surge performance and the energy discharge capability of the whole device. The present invention adopts the following two improvement measures to improve discharge capability of the diode:

First, decrease contact resistance of the diode area as far as possible through improving structure design, which is embodied in the impurity concentration of the diode area that changes according to the order of P+, P, N and N+ or P+, P, P−, N and N+, for decreasing resistivity of the PN junction of the diode. The Power that the diode endures itself is decreased effectively because of the decreased resistivity. This design plays a key role in improving the discharge capability when improving the current discharge effect.

Second, at the interface of the PN junction of the diode area is positioned a group of the deep-well structure, which forms a concave-convex type interface at the interface of the PN junction, and therefore effective contact area of the PN junction is greatly increased compared to a flat-type interface. Since the discharge capability is directly proportional to area of the PN junction, the discharge capability of the diode can be effectively increased in this way.

The device of the present invention can reach a level of 3000~3500 V according to the anti-lightning performance test.

In the above drawings: 1~8: pin; 9. substrate; 10. diode area; 11. thyristor area; 12. triode area; 13. P-type heavy diffusion layer; 14. P-type diffusion layer; 15. N-type heavy implanted layer; 16. N-type light doped layer; 17. deep-well; 18a. upper metal layer; 18b. upper metal layer; 18c. upper metal layer; 19. lower metal layer; 20. insulation medium layer; 21. N-type heavy implanted layer; 22. P-type diffusion layer; 23. P-type heavy diffusion layer; 24. short-circuit contact; 25. first N-type heavy implanted layer; 26. P-type diffusion layer; 27. second N-type heavy implanted layer; and 28. P-type heavy diffusion layer.

DETAILED DESCRIPTION OF THE INVENTION

The present invention will be further explained with reference to drawings and embodiments.

Embodiment 1

Figure 8:
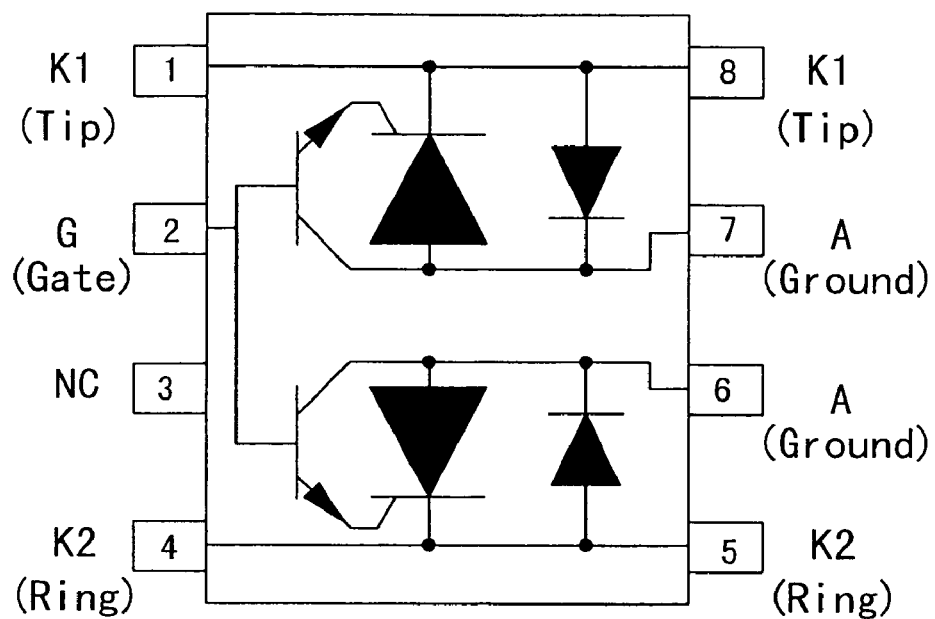
FIG. 8 is an electric schematic diagram of Embodiment 1 of the device of the present invention.
Figure 9:
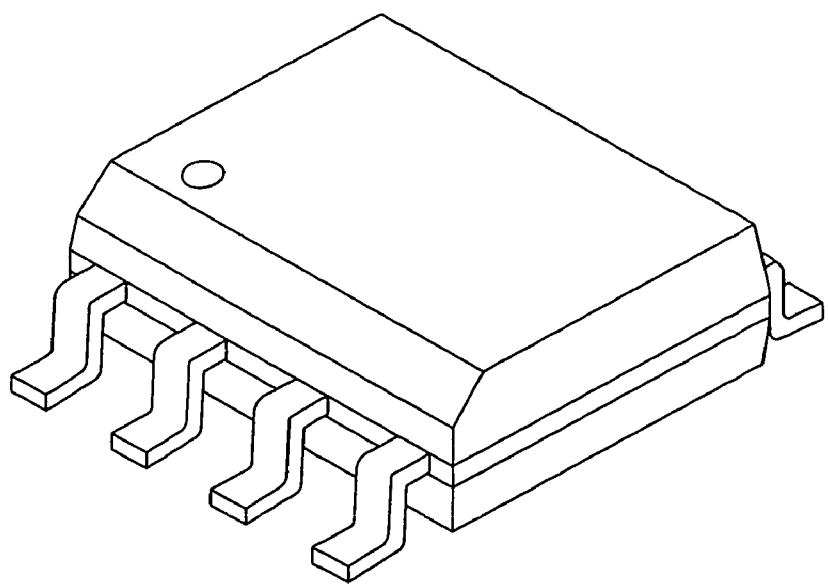
FIG. 9 is the profile of Embodiment 1 of the device of the present invention.

A Protection Device of Programmable Semiconductor Surge Suppressor Having Deep-Well Structure As shown in FIGS. 8 and 9, inside package body of this protection device are two protection units, each of which is composed of a PN-junction diode, a PNPN-type thyristor and a NPN-type triode; anode of the diode and cathode of the thyristor, connected with each other, act together as Port K of the protection unit; cathode of the diode, anode of the thyristor and collector of the triode, connected with each other, act together as Port A of the protection unit; and emitter of the triode and gate of the thyristor are connected with each other, base of the triode acting as Port G of the protection unit.

Figure 1:
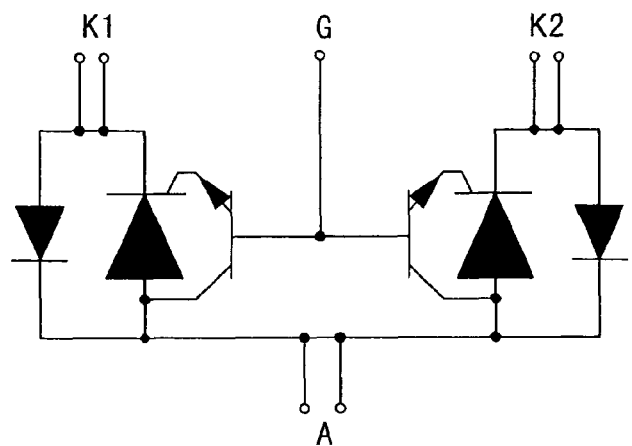
FIG. 1 is the circuit structure of the prior programmable anti-surge protection device P61089.
Figure 2:
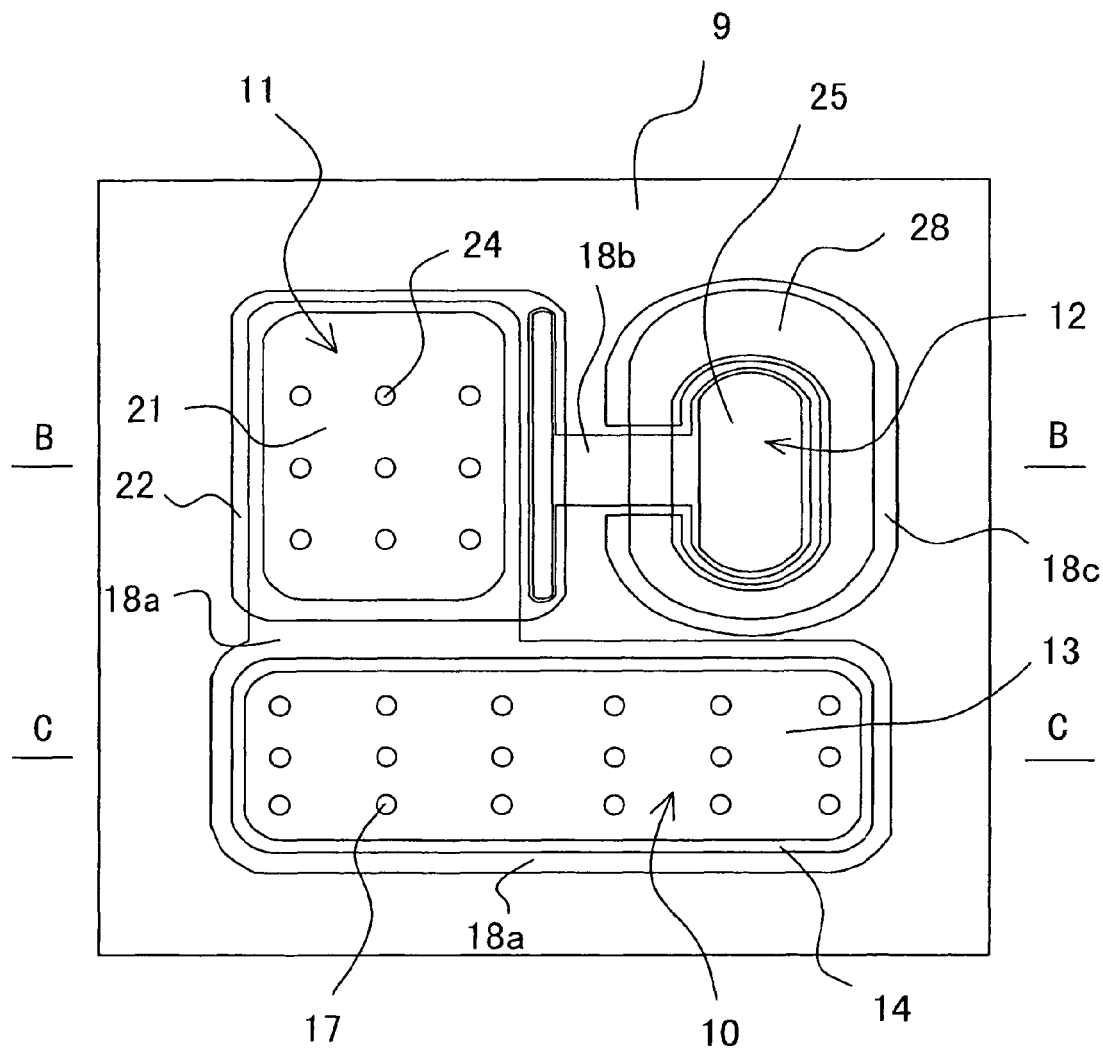
FIG. 2 is a plan view of the protection unit of the present invention.

FIG. 2 is a plan view of the protection unit of the present invention. It can be seen from FIG. 2 that each of the protection units, with an N-type semiconductor base as a substrate 9 and viewed from the top, corresponds to a semiconductor active region, each of which is composed of a diode area 10, a thyristor area 11 and a triode area 12.

Figure 4:
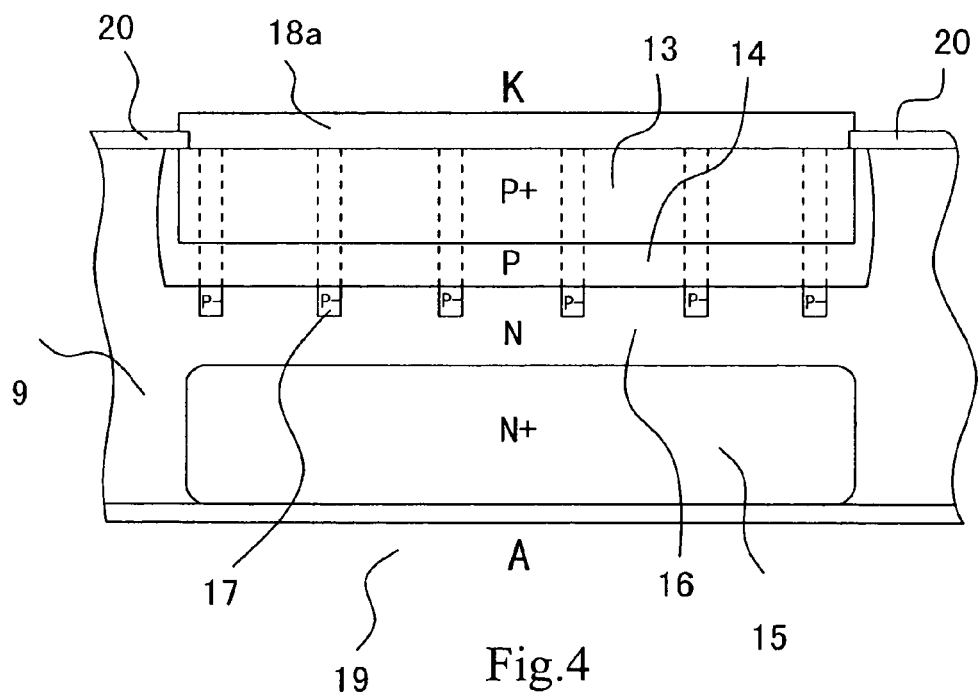
FIG. 4 is a sectional view along a line C-C in FIG. 2.
Figure 5:
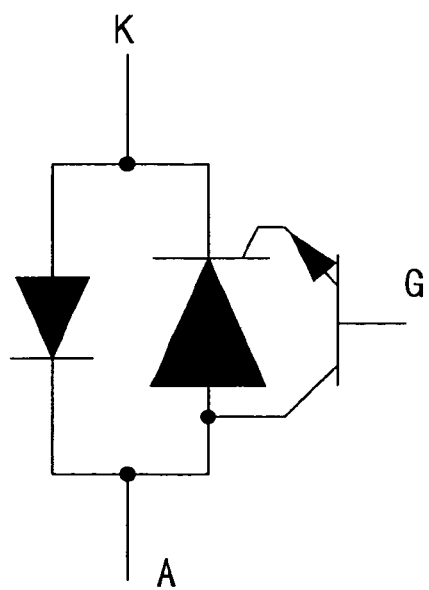
FIG. 5 is an electric schematic diagram of the protection unit of the present invention.

FIG. 4 is a sectional view of the diode area 10. It can be seen from the drawing that, viewed from the cross section, in the diode area 10 on the frontal side of the substrate 9 are positioned sequentially from top to bottom a P-type heavy diffusion layer 13 and a P-type diffusion layer 14, in the diode area 10 on the reverse side of the substrate 9 is positioned from bottom to top an N-type heavy implanted layer 15, between the P-type diffusion layer 14 and the N-type heavy implanted layer 15 of the diode area 10 is an N-type light doped layer 16 of the substrate 9 itself, and thus in the diode area 10 is formed a PN junction with impurity concentration changed gradiently from top to bottom according to the order of P+, P, N and N+. A group of deep-wells 17s are positioned at intervals at the interface between the P-type diffusion layer 14 and the N-type light doped layer 16, each of the deep-wells 17s being formed by means of boring a contact (boring a contact as shown in the drawing or trenching a trench are all feasible) downwards from the top of the N-type light doped layer 16 before depositing P-type or P-type light impurity materials in the contact, the top of the P-type doped or P-type light doped materials deposited in the contact or trench being connected with the bottom of the P-type diffusion layer 14, thus a concave-convex interface being formed in the PN junction. The two upright dotted lines above each of the deep-wells 17s in FIG. 4 mean that the deep-well is formed by means of boring a contact or trenching a trench downwards from the frontal side of the substrate 9. The substrate 9 is provided on the frontal side with a metal layer 18a, which is in contact with the P-type heavy diffusion layer 13. The rest of the frontal side of the diode area 10 is covered with an insulation medium layer 20. The substrate 9 is provided on the reverse side with a lower metal layer 19, which is in contact with the N-type heavy implanted layer 15.

Figure 3:
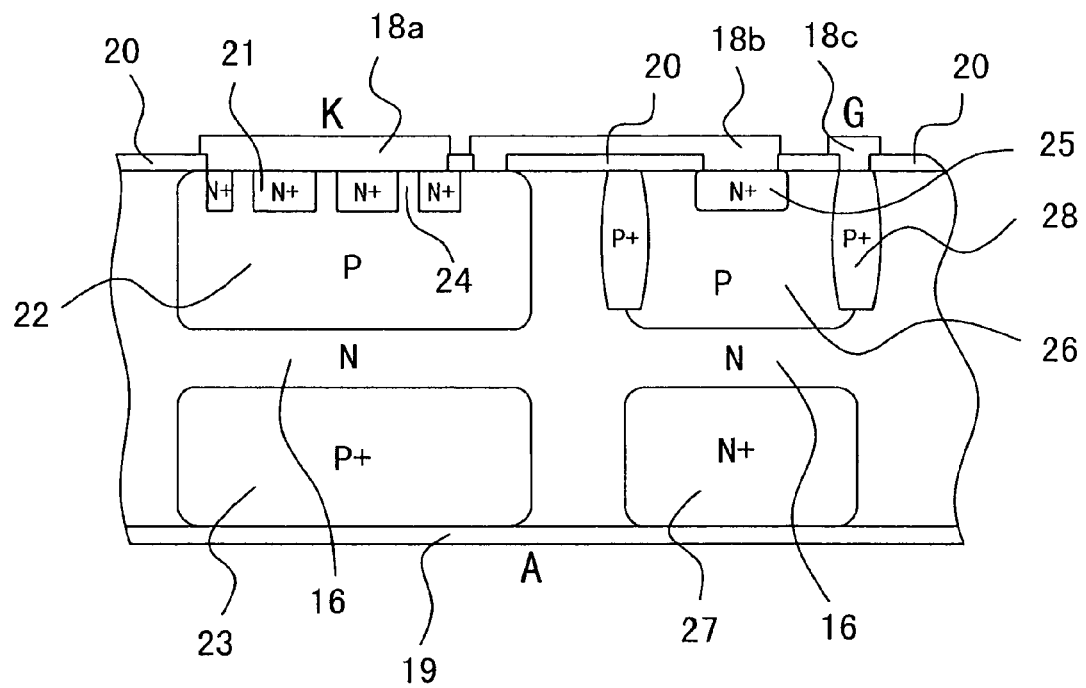
FIG. 3 is a sectional view along a line B-B in FIG. 2.

The left half of FIG. 3 is a sectional view of the thyristor area 11. It can be seen from the drawing that, viewed from the cross section, in the thyristor area 11 on the frontal side of the substrate 9 are positioned sequentially from top to bottom an N-type heavy implanted layer 21 and a P-type diffusion layer 22, in the thyristor area 11 on the reverse side of the substrate 9 is positioned from bottom to top a P-type heavy diffusion layer 23, between the P-type diffusion layer 22 and the P-type heavy diffusion layer 23 of the thyristor area 11 is the N-type light doped layer 16 of the substrate 9 itself, and thus a PNPN-type thyristor is formed from bottom to top in the thyristor area 11. In the N-type heavy implanted layer 21 of the thyristor area 11 are positioned at intervals a group of short-circuit contacts 24s, each of which is connected at the top with an upper metal layer 18a positioned above the N-type heavy implanted layer 21, the P-type diffusion layer 22 below the N-type heavy implanted layer 21 extending upwards to the upper metal layer 18a through the short-circuit contact 24. The substrate 9 is provided on the reverse side with a lower metal layer 19, which is in contact with the P-type heavy implanted layer 23.

The right half of FIG. 3 is a sectional view of the triode area 12. It can be seen from the drawing that, viewed from the cross section, in the triode area 12 on the frontal side of the substrate 9 are positioned sequentially from top to bottom a first N-type heavy implanted layer 25 and a P-type diffusion layer 26, in the triode area 12 on the reverse side of the substrate (9) is positioned from bottom to top a second N-type heavy implanted layer 27, between the P diffusion layer 26 and the second N-type heavy implanted layer 27 of the triode area 12 is the N-type light doped layer 16 of the substrate 9 itself, and thus an NPN-type triode is formed from top to bottom in the triode area 12. The P-type diffusion layer 26 of the triode area 12 is provided at the level outer peripheral portion with a P-type heavy diffusion ring 28, which is connected with the P-type diffusion layer 26 of the triode area 12. The substrate 9 is provided on the frontal side with an upper metal layer 18b, which is used for connecting the first N-type heavy implanted layer 25 of the triode area 12 and the P-type diffusion layer 22 of the thyristor area 11. The substrate 9 is provided on the frontal side with an upper metal layer 18c, which is in contact with the P-type heavy diffusion ring 28 of the triode area 12. The substrate 9 is provided on the reverse side with a lower metal layer 19, which is in contact with the second N-type heavy implanted layer 27.

Port A of the protection unit of the present invention is led out from the lower metal layer 19, Port K from the upper metal layer 18a, and Port G from the upper metal layer 18c.

Inside the package body of the protection device of this embodiment are two protection units, which can be made on either one piece or two separate pieces of the N-type semiconductor base, both being totally equivalent.

Figure 10:
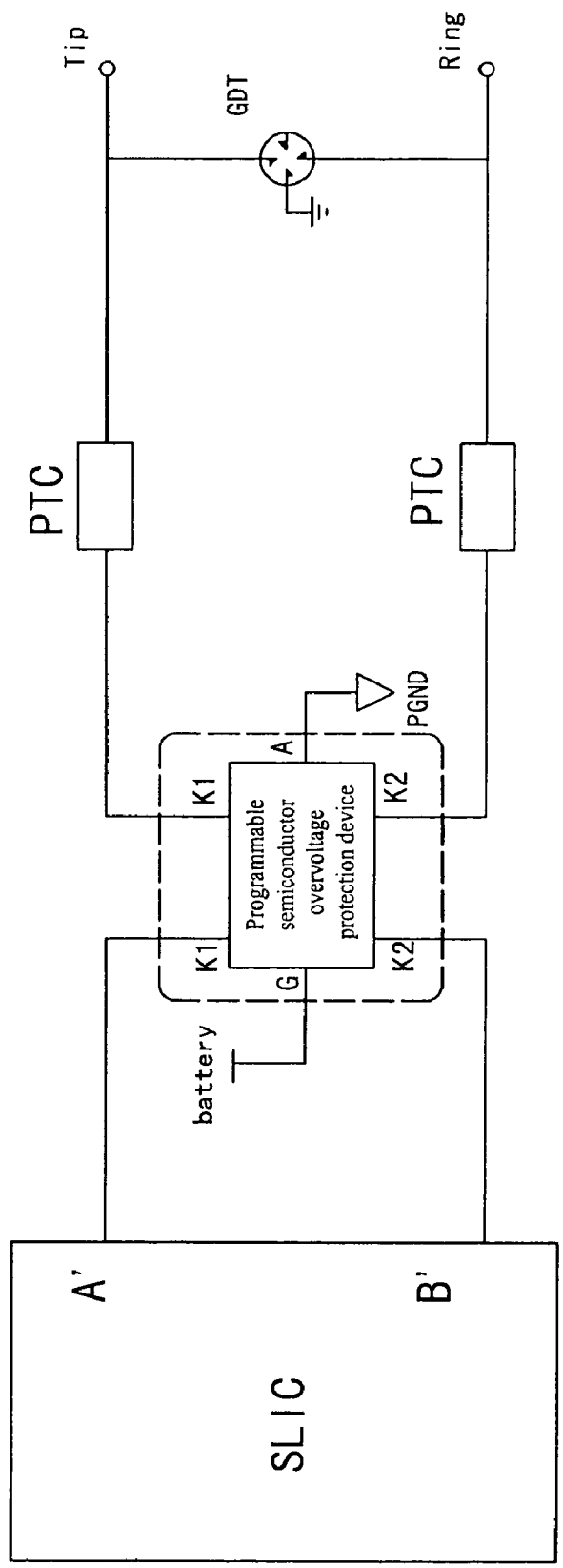
FIG. 10 is an embodiment of application of the device of the present invention.

FIG. 10 is an embodiment of application of the device of the present invention. It can be seen from the drawing that the device of this embodiment has two protection units, which are used in the program-controlled switchboard to protect the Subscriber Line Interface Circuit (SLIC) board. The connection relation in application can be obtained with reference to FIGS. 8 and 10.

Figures 6, 7:
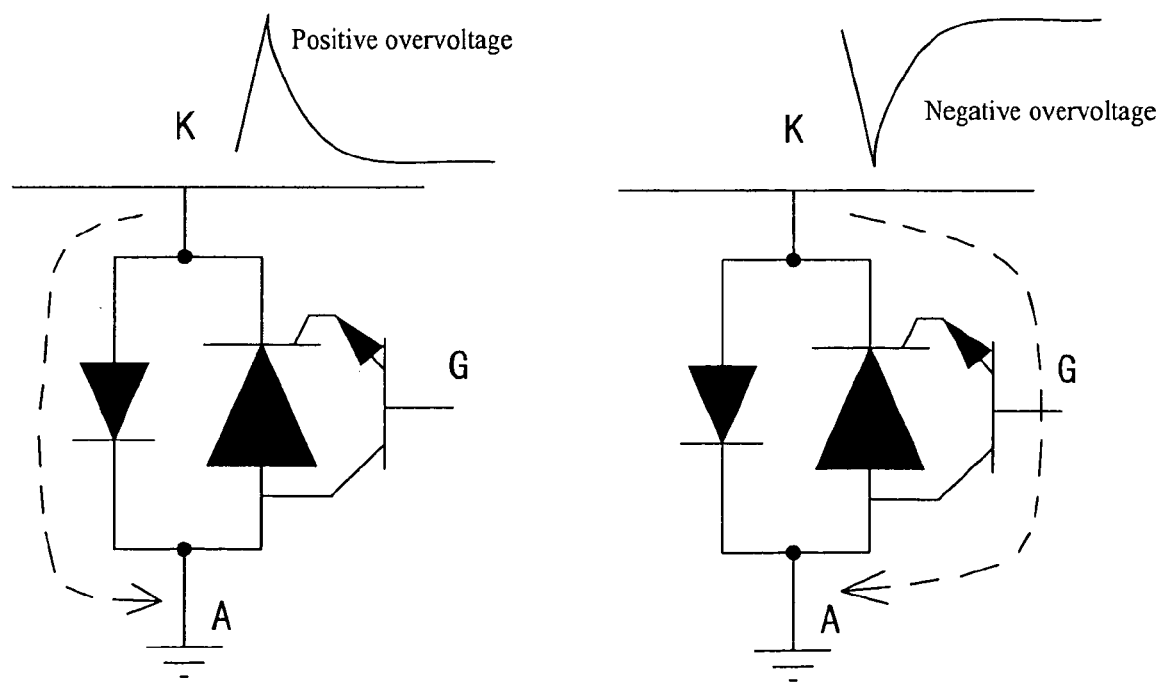
FIG. 6 is a schematic diagram of positive overvoltage protection of the protection unit of the present invention.
FIG. 7 is a schematic diagram of negative overvoltage protection of the protection unit of the present invention.

As shown in FIG. 6, when a positive surge occurs in a circuit during application, the forward diode is turned on quickly, discharging the surge energy to earth and preventing the surge impact from entering the Subscriber Line Interface Circuit (SLIC) board, thus protecting devices on the Subscriber Line Interface Circuit (SLIC) board. As shown in FIG. 7, when a backward surge occurs in the circuit, the gate-controlled triode is turned on quickly and injects current into the thyristor, thus causing positive feedback of the current and making anode and cathode of the thyristor enter the latch conduction state, discharging the surge energy to earth and preventing the surge impact from entering the Subscriber Line Interface Circuit (SLIC) board, thus protecting the devices on the Subscriber Line Interface Circuit (SLIC) board.

In order to guarantee the long-distance transmission (e.g. telephone popularization in the vast rural area), the operational power supply of the SLIC board needs to be increased from −48 V to −65 V or −75 V; that is, hardware programming is performed on the protective voltage of the device. It is currently required that a broader range of the input voltage of the programmable semiconductor anti-surge protection device is to be programmed, and the surge voltage endurance capability is higher. The present invention greatly increases current conduction capability of the device, which has an obviously improved voltage endurance capability, a fast response speed, a strong current endurance capability, and a long life.

Embodiment 2

A Protection Device of Programmable Semiconductor Surge Suppressor Having Deep-Well Structure This protection device is different from that in Embodiment 1 only in that there is only one protection unit inside the package body of the device. Structure and content of this protection unit are identical with those in Embodiment 1, and will not be described here again.

Embodiment 3

A Programmable Semiconductor Anti-Surge Protection Device Having Deep-Well Structure This protection device is different from that in Embodiment 1 only in that there are four protection units inside the package body of the device. Structure and content of each of the protection units are identical with those in Embodiment 1, and will not be described here again. The device of this embodiment having four protection units includes two pairs of two-way bi-directional semiconductor anti-surge protection devices.

The above embodiments are used only for explaining the technical concept and characteristics of the present invention. They are provided to make those skilled in the art understand the present invention and implement it, and cannot thereby limit the extent of protection of the present invention. All equivalent changes or modifications according to the spirit of the present invention should fall within the extent of protection of the present invention.

What is claimed is:
1. A protection device of programmable semiconductor surge suppressor having deep-well structure comprising:
one, two or four protection units, each of the protection units being composed of a PN-junction diode, a PNPN-type thyristor and a NPN-type triode;

anode of the diode and cathode of the thyristor, connected with each other, act together as Port K of the protection unit;

cathode of the diode, anode of the thyristor and collector of the triode, connected with each other, act together as Port A of the protection unit; and emitter of the triode and gate of the thyristor are connected with each other, base of the triode acting as Port G of the protection unit;

wherein said protection device used an N-type semiconductor base as a substrate, viewed from the top, each of the protection units corresponds to a semiconductor active region which is composed of a diode area, a thyristor area and a triode area;

viewed from the cross section, in the diode area on the frontal side of the substrate are positioned sequentially from top to bottom a P-type heavy diffusion layer and a P-type diffusion layer, in the diode area on the reverse side of the substrate is positioned from bottom to top an N-type heavy implanted layer, between the P-type diffusion layer and the N-type heavy implanted layer of the diode area is an N-type light doped layer of the substrate itself, and thus in the diode area is formed a PN junction with impurity concentration changed gradiently from top to bottom according to the order of P+, P, N and N+; and a group of deep-well are positioned at intervals at the interface between the P-type diffusion layer and the N-type light doped layer, each of the deep-well being formed by means of boring a contact or trenching a trench downwards from the top of the N-type light doped layer before depositing P-type doped or P-type light doped materials in the contact or trench, the top of the P-type doped or P-type light doped materials deposited in the contact or trench being connected with the bottom of the P-type diffusion layer, thus a concave-convex interface being formed in the PN junction.

2. The programmable semiconductor anti-surge protection device according to claim 1, wherein viewed from the cross section, in the thyristor area on the frontal side of the substrate are positioned sequentially from top to bottom an N-type heavy implanted layer and a P-type diffusion layer, in the thyristor area on the reverse side of the substrate is positioned from bottom to top a P-type heavy diffusion layer, between the P-type diffusion layer and the P-type heavy diffusion layer of the thyristor area is the N-type light doped layer of the substrate itself, and thus a PNPN-type thyristor is formed from bottom to top in the thyristor area.

3. The programmable semiconductor anti-surge protection device according to claim 2, wherein in the N-type heavy implanted layer of the thyristor area are positioned at intervals a group of short-circuit contacts, each of which is connected at the top with an upper metal layer positioned above the N-type heavy implanted layer, the P-type diffusion layer below the N-type heavy implanted layer extending upwards to the upper metal layer through the short-circuit contact.

4. The programmable semiconductor anti-surge protection device according to claim 1, wherein viewed from the cross section, in the triode area on the frontal side of the substrate are positioned sequentially from top to bottom the first N-type heavy implanted layer and the P-type diffusion layer, in the triode area on the reverse side of the substrate is positioned from bottom to top a second N-type heavy implanted layer, between the P-type diffusion layer and the second N-type heavy implanted layer of the triode area is the N-type light doped layer of the substrate itself, and thus an NPN-type triode is formed from top to bottom in the triode area.

5. The programmable semiconductor anti-surge protection device according to claim 4, wherein the P-type diffusion layer of the triode area is provided at the level outer peripheral portion with a P-type heavy diffusion ring, which is connected with the P-type diffusion layer of the triode area.

* * * * *